US008956702B2

(12) United States Patent
Kawai et al.

(10) Patent No.: US 8,956,702 B2
(45) Date of Patent: Feb. 17, 2015

(54) RESIN COMPOSITION FOR INSULATING LAYER FOR MULTI-LAYERED PRINTED BOARD

(71) Applicant: Ajinomoto Co., Inc., Chuo-ku (JP)

(72) Inventors: Kenji Kawai, Kawasaki (JP); Shigeo Nakamura, Kawasaki (JP)

(73) Assignee: Ajinomoto Co., Inc., Chuo-ku (JP)

( * ) Notice: Subject to any disclaimer, the term of this patent is extended or adjusted under 35 U.S.C. 154(b) by 13 days.

(21) Appl. No.: 14/136,107

(22) Filed: Dec. 20, 2013

(65) Prior Publication Data

US 2014/0102623 A1    Apr. 17, 2014

Related U.S. Application Data

(62) Division of application No. 11/564,418, filed on Nov. 29, 2006.

(30) Foreign Application Priority Data

Nov. 29, 2005   (JP) ................................. 2005-344686
Feb. 22, 2006   (JP) ................................. 2006-045637

(51) Int. Cl.

| B05D 3/12 | (2006.01) |
|---|---|
| B05D 7/14 | (2006.01) |
| C08L 63/00 | (2006.01) |
| H05K 3/46 | (2006.01) |
| C08G 59/62 | (2006.01) |
| C08L 71/00 | (2006.01) |
| C08L 21/00 | (2006.01) |
| H05K 3/38 | (2006.01) |

(52) U.S. Cl.
CPC ............ *H05K 3/4688* (2013.01); *C08G 59/621* (2013.01); *C08L 63/00* (2013.01); *C08L 71/00* (2013.01); *H05K 3/4661* (2013.01); *H05K 3/4632* (2013.01); *C08L 21/00* (2013.01); *H05K 3/381* (2013.01); *H05K 2201/0133* (2013.01); *H05K 2201/0212* (2013.01)
USPC ............................................ 427/445; 525/31

(58) Field of Classification Search
USPC .......................................................... 427/445
See application file for complete search history.

(56) References Cited

U.S. PATENT DOCUMENTS

| 6,403,221 | B1 | 6/2002 | Nakamura et al. |
|---|---|---|---|
| 6,805,958 | B2 | 10/2004 | Nakamura et al. |
| 2004/0237295 | A1 | 12/2004 | Wakizaka et al. |
| 2005/0008868 | A1 | 1/2005 | Nakamura et al. |
| 2005/0255270 | A1 | 11/2005 | Takanezawa et al. |
| 2007/0295607 | A1 | 12/2007 | Kawai |

FOREIGN PATENT DOCUMENTS

| JP | 2003-253094 | 9/2003 |
|---|---|---|
| JP | 2003-286390 | 10/2003 |
| JP | 2003-286391 | 10/2003 |
| JP | 2004-286391 | 10/2004 |
| JP | 2005-154727 | 6/2005 |
| JP | 2005-206831 | 8/2005 |

OTHER PUBLICATIONS

Office Action issued Sep. 13, 2011, in Japanese Patent Application No. 2006-320769 (with English-language translation).
Office Action issued Dec. 13, 2011, in Japanese Patent Application No. 2006-320769 (with English Translation).
English language machine translation of JP 2003-286391, (2003).
English machine translation of Yano et al., JP 2003-286390 A (2003).

*Primary Examiner* — Peter F Godenschwager
(74) *Attorney, Agent, or Firm* — Oblon, Spivak, McClelland, Maier & Neustadt, L.L.P.

(57) ABSTRACT

Epoxy resin compositions, which comprise (A) en epoxy resin having two or more epoxy groups in a molecule; (B) a phenol type curing agent where an average hydroxyl group content in a molecule (a mean value of (the total number of hydroxyl groups)/(the total number of benzene rings)), P, satisfies the equation 0<P<1; (C) a phenoxy resin; and (D) rubber particles, are suitable for use as an insulating layer of a multi-layered printed board in which, in spite of the fact that the roughness of a roughened surface after a roughening treatment is relatively small, an insulating layer having a good tight adhesion with a conductor layer formed by plating is able to be easily introduced into a multi-layered printed board.

26 Claims, No Drawings

RESIN COMPOSITION FOR INSULATING LAYER FOR MULTI-LAYERED PRINTED BOARD

CROSS REFERENCES TO RELATED APPLICATIONS

This application is a Divisional Application of U.S. patent application Ser. No. 11/564,418, filed on Nov. 29, 2006, and claims priority to Japanese Patent Application No. 344686/2005, filed on Nov. 29, 2005, and Japanese Patent Application No. 045637/2006, filed on Feb. 22, 2006, both of which are incorporated herein by reference in their entireties.

BACKGROUND OF THE INVENTION

1. Field of the Invention

The present invention relates to epoxy resin compositions which are suitable for the formation of insulating layers for multi-layered printed boards.

2. Discussion of the Background

In recent years, a tendency of making electronic instruments small in size and highly efficient is increasing and, in a multi-layered printed board, a build-up layer is made into multi-layered, and a tendency of making the wiring finer and more dense is also further increasing. With regard to a method for the formation of a conductor layer suitable for the formation of fine wiring of high density, there have been known an additive method in which the surface of an insulating layer is subjected to a roughening treatment and then a conductor layer is formed by nonelectrolytic plating and a semi-additive method in which a conductor layer is formed by nonelectrolytic plating and electrolytic plating. In those methods, the adhesiveness of the insulating layer to a plated conductor layer (plated copper) is mostly ensured by means of the unevenness of the surface of an insulating layer (resin surface) formed by a roughening treatment (or, in other words, an anchor effect is achieved between the insulating layer and the plated layer because the surface of the insulating layer (resin surface) has unevenness). Accordingly, in enhancing the adhesiveness, there will be a way to make the degree of unevenness (roughness) of the surface of the insulating layer bigger.

However, for making the density of wiring higher, it is preferred that the roughness of the insulating layer surface (resin surface) is small. Thus, when the roughness of the insulating layer surface (resin surface) is high in case the wiring formation is finished by removal of a plated layer in thin membrane by means of flash etching after formation of a conductor layer (plated layer) by nonelectrolytic plating or electrolytic plating.

If the roughness of the insulating layer surface (resin surface) is large, a flash etching for a long time is necessary for removal of plated residue (smear) which gets into the concave when the wiring formation is finished by removal of a plated layer in thin membrane by means of flash etching after formation of a conductor layer (plated layer) by nonelectrolytic plating or electrolytic plating. On the other hand, if a flash etching is carried out for long time, in consequence of that, a risk of damaging or cutting fine wiring becomes high. Accordingly, in order to form a highly reliable wiring in a high density, it is demanded for the insulating layer surface that adhesiveness to a plated conductor is good, even when roughness after the roughening treatment is small. However, up to now, no insulating material which is able to form a rough surface having such a property has been developed.

JP-A-2005-154727 discloses that, when an epoxy resin composition containing specific two kinds of epoxy resins, a phenol type curing agent, a specific thermoplastic resin (such as polyvinyl acetal and phenoxy resin), and an inorganic filler in a predetermined rate is used in an insulating layer for a multi-layered printed board, it shows a low thermal expansion coefficient and is good in a peel strength of the conductor layer formed by a plating.

JP-A-2003-286390 discloses that, when an epoxy resin composition containing specific amounts of epoxy resin, multivalent hydroxy resin curing agent, phenoxy resin of a bisphenol A type or F type, specific rubber component, and curing promoter is used for an insulating layer, etc. of a multi-layered printed board, it shows good heat resistance, mechanical strength, film supporting property, etc.

JP-A-2004-286391 discloses that, when an epoxy resin composition containing specific amounts of epoxy resin, specific phenol vinyl aralkyl type resin curing agent, specific phenoxy resin, specific rubber component, and curing promoter is used for an insulating layer, etc. of a multi-layered printed board, it shows good heat resistance, mechanical strength, film supporting property, etc.

However, even in those Patent Documents which disclose various kinds of resin compositions as such, there is no disclosure of a resin composition which gives a low roughness and high peel strength for using as an insulating layer and there is no indication therein for such a problem to be solved.

SUMMARY OF THE INVENTION

Accordingly, it is one object of the present invention to provide novel epoxy resin compositions which are suitable for use as an insulating layer of a multi-layered printed board.

It is another object of the present invention to provide novel epoxy resin compositions which are suitable for use as an insulating layer of a multi-layered printed board in which, in spite of the fact that the roughness of a roughened surface after a roughening treatment is relatively small, there is provided an epoxy resin composition in which the roughened surface is able to achieve an insulating layer (interlayer insulating layer) showing a high adhesiveness to a plated conductor.

These and other objects, which will become apparent during the following detailed description, have been achieved by the inventors' discovery that, in an epoxy resin composition where an epoxy resin is compounded with a phenoxy resin, a specific phenol type curing agent, and rubber particles, when a cured product prepared by curing of the epoxy resin composition is subjected to a roughening treated, the resulting roughened surface having even a relatively low roughness is able to be tightly adhered to a plated conductor with a high adhesive property.

Thus, the present invention provides the following:

(1) An epoxy resin composition, which comprises:

(A) an epoxy resin having two or more epoxy groups in a molecule;

(B) a phenol type curing agent where an average hydroxyl group content in a molecule (mean value of (the total number of hydroxyl groups)/(the total number of benzene rings)) P is $0 < P < 1$;

(C) a phenoxy resin; and (D) rubber particles.

(2) The epoxy resin composition according to the above (1), wherein the phenol type curing agent of the component (B) is a phenol type curing agent represented by formula (1) or (2):

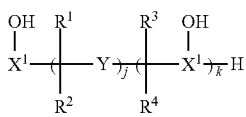
(1)

wherein $R^1$ to $R^4$ are each independently hydrogen atom or an alkyl group; $X^1$ is a benzene ring, hydroxyl benzene ring, naphthalene ring or hydroxyl naphthalene ring each of which may be substituted with an alkyl group; Y is a benzene ring, hydroxyl benzene ring, or a biphenyl ring each of which may be substituted with an alkyl group; and j and k are each independently a number of 1 to 15 as an average value;

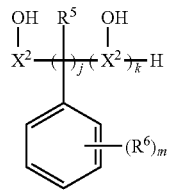
(2)

wherein $R^5$ is hydrogen atom or an alkyl group; $R^6$ is hydrogen atom, an alkyl group, or a thioalkyl group; $X^2$ is a benzene ring or naphthalene ring each of which may be substituted with an alkyl group; j and k are each a number of 1 to 15 as an average value; and m is an integer of 1 to 5.

(3) The epoxy resin composition according to the above (1), wherein the phenol type curing agent of the component (B) is a phenol type curing agent represented by formula (1') or (2'):

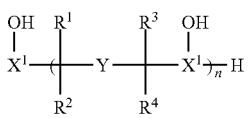
(1')

wherein $R^1$ to $R^4$ are each independently hydrogen atom or an alkyl group; X' is a benzene ring, hydroxyl benzene ring, naphthalene ring or hydroxyl naphthalene ring each of which may be substituted with an alkyl group; Y is a benzene ring, hydroxyl benzene ring, or a biphenyl ring each of which may be substituted with an alkyl group; and n is a number of 1 to 15 as an average value;

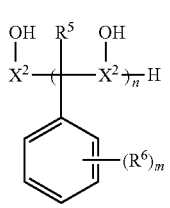
(2')

wherein $R^5$ is hydrogen atom or an alkyl group; $R^6$ is hydrogen atom, an alkyl group, or a thioalkyl group; $X^2$ is a benzene ring or naphthalene ring each of which may be substituted with an alkyl group; n is a number of 1 to 15 as an average value; and m is an integer of 1 to 5.

(4) The epoxy resin composition according to the above (1), wherein the phenol type curing agent of the component (B) is a phenol type curing agent represented by any of formulae (3) to (5):

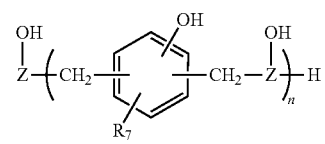
(3)

wherein $R^7$ is hydrogen atom or methyl group; Z is naphthalene ring; and n is a number of 1 to 15 as an average value;

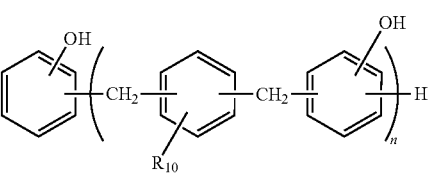
(4)

wherein $R^8$ and $R^9$ are each independently hydrogen atom or methyl group; and n is a number of 1 to 15 as an average value;

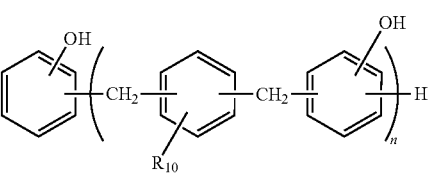
(5)

wherein $R^{10}$ is hydrogen atom or methyl group; and n is a number of 1 to 15 as an average value.

(5) The epoxy resin composition according to the above (1), wherein the phenol type curing agent of the component (B) is a phenol type curing agent represented by formula (6):

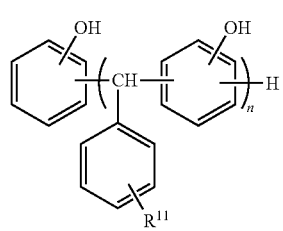
(6)

wherein $R^{11}$ is hydrogen atom, methyl group, or thiomethyl group; and n is a number of 1 to 15 as an average value.

(6) The epoxy resin composition according to the above (1), wherein the phenol type curing agent of the component (B) is a phenol type curing agent represented by formula (7):

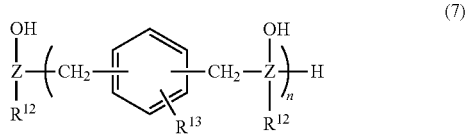

wherein $R^{12}$ is hydrogen atom, a methyl group or hydroxyl group; $R^{13}$ is hydrogen atom, a methyl group, or hydroxyl group; Z is a naphthalene ring; and n is a number of 1 to 15 as an average value.

(7) The epoxy resin composition according to any of the above (1) to (6), wherein the epoxy resin of the component (A) comprises:

(A1) a first epoxy resin which is an aromatic epoxy resin having two or more epoxy groups in a molecule and being liquid at the temperature of 20° C.; and (A2) a second epoxy resin which is an aromatic epoxy resin having three or more epoxy groups in a molecule and being solid at the temperature of 20° C.

(8) The epoxy resin composition according to the above (7), wherein the second epoxy resin of the component (A2) has an epoxy equivalent weight of not more than 230.

(9) The epoxy resin composition according to the above (7), wherein the second epoxy resin of the component (A2) has an epoxy equivalent weight within a range of 150 to 230.

(10) The epoxy resin composition according to any of the above (7) to (9), wherein the first epoxy resin (A1) and the second epoxy resin (A2) are present in a compounding ratio (A1:A2) of the first epoxy resin (A1) to the second epoxy resin (A2) within a range of 1:0.3 to 1:2 in terms of mass.

(11) The epoxy resin composition according to any of the above (1) to (10), wherein, when the non-volatile component of the epoxy resin composition is 100% by mass, the content of the component (A) is 10 to 50% by mass, the content of the component (C) is 1 to 20% by mass, and the content of the component (D) is 1 to 10% by mass, and the ratio of the phenol type curing agent to the epoxy group existing in the epoxy resin composition is from 1:0.5 to 1:1.5.

(12) The epoxy resin composition according to any of the above (1) to (11), wherein the epoxy resin composition further comprises an inorganic filler.

(13) The epoxy resin composition according to the above (12), wherein, when the non-volatile component of the epoxy resin composition is 100% by mass, the composition further comprises 10 to 75% by mass of the inorganic filler.

(14) An adhesive film, comprising an epoxy resin composition mentioned in any of the above (1) to (13) formed in a layer on a support film

(15) A prepreg, comprising an epoxy resin composition mentioned in any of the above (1) to (13) which is impregnated into a sheet-form reinforcing substrate comprising fiber.

(16) A multi-layered printed board, comprising an insulating layer which is a cured product of the epoxy resin composition mentioned in any of the above (1) to (13).

(17) A method for the manufacture of a multi-layered printed board, which method comprises forming an insulating layer on an inner layer circuit substrate and forming a conductor layer on the insulating layer, wherein the insulating layer is formed by thermally curing an epoxy resin composition mentioned in any of the above (1) to (13) and the conductor layer is formed by copper plating on a roughened surface by subjecting the insulating layer to surface roughening.

(18) A method for the manufacture of a multi-layered printed board, which method comprises forming an insulating layer on an inner layer circuit substrate and forming a conductor layer on said insulating layer, wherein the insulating layer is formed by laminating an adhesive film mentioned in the above (14) on an inner layer circuit substrate and, with or without releasing the support film, thermally curing the epoxy resin composition followed by removing the support film in case the support film is present after curing, and the conductor layer is formed in such a manner that a copper plating is conducted on a roughened surface prepared by a roughening treatment of the insulating layer surface.

(19) A method for the manufacture of a multi-layered printed board, which method comprises forming an insulating layer on an inner layer circuit substrate and forming a conductor layer on said insulating layer, wherein the insulating layer is formed by laminating a prepreg mentioned in the above (15) on an inner layer circuit substrate and thermally curing the epoxy resin composition, and forming the conductor layer in such a manner that a roughed surface prepared by a roughening treatment of said insulating layer surface is subjected to a copper plating.

(20) The method according to any of the above (17) to (19), wherein the roughening treatment is carried out using an oxidizing reagent.

(21) The method according to any of the above (17) to (19), wherein the roughening treatment is carried out using a solution of alkaline permanganic acid.

In accordance with the present invention, it is now possible that, in spite of the fact that the roughness of a roughened surface after a roughening treatment is relatively small, an insulating layer having a good tight adhesion with a conductor layer formed by plating is able to be easily introduced into a multi-layered printed board. Thus, when an insulating layer comprising the cured product of the resin composition of the present invention is introduced to manufacture a multi-layered printed board, a plated conductor (conductor layer) is able to be held with a high adhesive force in spite of the fact that the roughened surface prepared by a roughening treatment of an insulating layer with an oxidizing agent has a relatively lower roughness and, as a result, a flash etching upon finishing a wiring formation by removal of the unnecessary part of the plated conductor layer by means of flash etching is able to be carried out within short time. Accordingly, it is now possible that a high-density wiring having a highly reliable adherence to an insulating layer with a high adhesive force (peel strength) and having neither damage nor cutting is able to be formed with a high reproducibility.

DETAILED DESCRIPTION OF THE PREFERRED EMBODIMENTS

The present invention will now be illustrated in more detail as follows.

Epoxy Resin of the Component (A):

There is no particular limitation for the "epoxy resin having two or more epoxy groups in a molecule" for the component (A) in the present invention, and its examples include a cresol novolak type epoxy resin, a phenol novolak type epoxy resin, a tert-butyl-catechol type epoxy resin, a biphenyl type epoxy resin, a bisphenol A type epoxy resin, a bisphenol F type epoxy resin, a naphthalene type epoxy resin, linear aliphatic epoxy resin, alicyclic epoxy resin, a glycidyl amine type epoxy resin, heterocyclic epoxy resin, epoxy resin containing spiro-ring, and halogenated epoxy resin.

Although the epoxy resin of the component (A) may be used either solely or two or more thereof may be used jointly, an embodiment in which "(A1) the first epoxy resin which is an aromatic epoxy resin having two or more epoxy groups in a molecule and being liquid at the temperature of 20° C." and "(A2) the second epoxy resin which is an aromatic epoxy resin having three or more epoxy groups in a molecule and being solid at the temperature of 20° C." are used together is preferred. With regard to the second epoxy resin, that where an epoxy equivalent weight is not less than 230 is more preferred and that where an epoxy equivalent weight is within a range of 150 to 230 is particularly preferred. Incidentally, an aromatic epoxy resin means an epoxy resin having an aromatic ring skeleton in its molecule. The epoxy equivalent weight is the molecular weight per one epoxy group.

When the first epoxy resin (A1) and the second epoxy resin (A2) are used together as an epoxy resin (A), an adhesive film having a sufficient flexibility (having an excellent handling property) is able to be formed in case the resin composition is used in a form of an adhesive film and, at the same time, breaking tenacity of the cured product of the resin composition is enhanced and the durability of a multi-layered printed board is improved.

With regard to "(A1) the first epoxy resin which is an aromatic epoxy resin having two or more epoxy groups in a molecule and being liquid at the temperature of 20° C." in the present invention, its examples includes a bisphenol A type epoxy resin, a bisphenol F type epoxy resin, a phenol novolak type epoxy resin, a tert-butyl catechol type epoxy resin, a naphthalene type epoxy resin, and a glycidyl amine type epoxy resin. In the present invention, the first epoxy resin (A1) may be used either solely or two or more thereof may be used jointly. The first epoxy resin (A1) may be liquid at the temperature of lower than 20° C.

With regard to such an epoxy resin, its specific examples are HP 4032 (manufactured by Dainippon Ink and Chemicals, Inc.), HP 4032 D (manufactured by Dainippon Ink and Chemicals, Inc.), jER 807 (Epikote 807) (manufactured by Japan Epoxy Resins Co., Ltd.), jER 828EL (Epikote 828EL) (manufactured by Japan Epoxy Resins Co., Ltd.), and jER 152 (Epikote 152) (manufactured by Japan Epoxy Resins Co., Ltd.).

With regard to "(A2) the second epoxy resin which is an aromatic epoxy resin having three or more epoxy groups in a molecule and being solid at the temperature of 20° C.", its examples include a naphthalene type epoxy resin and epoxylated product of a condensate of phenol compound with an aromatic aldehyde having a phenolic hydroxyl group (a trisphenol type epoxy resin). With regard to the second epoxy resin, that where an epoxy equivalent weight is not less than 230 is preferred and that where an epoxy equivalent weight is within a range of 150 to 230 is particularly preferred for an improvement in properties of such as glass transition temperature of the resin composition. Accordingly, in the present invention, the second epoxy resin (A2) is preferably "an aromatic epoxy resin having three or more epoxy groups in a molecule, having an epoxy equivalent weight of not more than 230 and being solid at the temperature of 20° C." and, more preferably, "an aromatic epoxy resin having three or more epoxy groups in a molecule, having an epoxy equivalent weight within a range of 150 to 230 and being solid at the temperature of 20° C.". The second epoxy resin (A2) may be used either solely or two or more thereof may be used jointly. The second epoxy resin (A2) may be solid at the temperature of higher than 20° C.

With regard to such an epoxy resin, its specific examples are HP 4700 (EXA 4700) (a tetra-functional naphthalene type epoxy resin, epoxy equivalent weight: 163; solid), N-690 (cresol novolak epoxy resin; epoxy equivalent weight: 208; solid) and N-695 (cresol novolak epoxy resin: epoxy equivalent weight: 208; solid) (manufactured by Dainippon Ink and Chemicals, Inc.); EPPN-502H (trisphenol epoxy resin; epoxy equivalent weight: 168; solid), NC 7000L (naphthol novolak epoxy resin; epoxy equivalent weight: 228; solid) and NC 3000H (a biphenyl type epoxy resin; epoxy equivalent weight: 290; solid) (manufactured by Nippon Kayaku Co., Ltd.); and ESN 185 (a naphthol novolak type epoxy resin; epoxy equivalent weight: 275; solid), and ESN 475 (a naphthol novolak type epoxy resin; epoxy equivalent weight: 350; solid) (manufactured by Tohto Kasei Co., Ltd.).

When the first epoxy resin (A1) and the second epoxy resin (A2) are used together as the epoxy resin (A), the compounding ratio by mass of the first epoxy resin (A1) to the second epoxy resin (A2) is preferably within a range of 1:0.3 to 2 and, more preferably, within a range of 1:0.5 to 1. When the rate of the first epoxy resin (A1) is too much beyond such a range, the adhesive property of the resin composition becomes high and, in case it is used in a form of an adhesive film, there is a tendency that deaeration property upon a vacuum lamination lowers and that voids are apt to be generated. There is also a tendency that, upon a vacuum lamination, the releasing property of protective film and supporting film is lowered and that the heat resistance after curing is lowered. There is further a tendency that a sufficient breaking tenacity is hardly available in a cured product of the resin composition. On the contrary, when the rate of the second epoxy resin (A2) is too much beyond such a range, there are tendencies in the case of use as an adhesive film that a sufficient flexibility is not available, that handling property lowers and that a sufficient fluidity is hardly available upon lamination.

When the non-volatile component in the epoxy resin composition is 100% by mass in the epoxy resin composition of the present invention, the amount of the epoxy resin of the component (A) is preferably 10 to 50% by mass, more preferably 20 to 40% by mass and, particularly preferably, 20 to 35% by mass. When the amount of the epoxy resin (A) is out of such a range, there is a tendency that curing property of the resin composition lowers. The epoxy resin composition of the present invention may also contain an epoxy resin other than the component (A) within such an extent that the advantages of the present invention are achieved (usually, not more than 50% by mass when the non-volatile component of the epoxy resin composition is 100% by mass).

A Phenol Type Curing Agent of the Component (B):

The phenol type curing agent used in the present invention is a phenol type curing agent in which an average hydroxyl group amount in a molecule ((the total number of hydroxyl groups)/(the total number of benzene rings)) (P) is 0<P<1. Such phenolic curing agents can be used without any particularly limitation. The scope of the average content ratio of hydroxyl groups in one molecule (P) is $1/4<P<9/10$ is preferable, and furthermore $1/3 \leq P \leq 4/5$ is more preferable. Incidentally, "a phenol type curing agent" used here means a compound which has two or more phenolic hydroxyl groups in a molecule and acts as a curing agent for the epoxy resin (A).

With regard to "the phenol type curing agent in which an average hydroxyl group amount in a molecule ((the total number of hydroxyl groups)/(the total number of benzene rings)) (P) is 0<P<1", a phenol type curing agent represented by formula (1) or (2) is preferred.

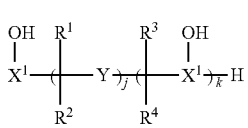
(1)

wherein $R^1$ to $R^4$ are each independently hydrogen atom or an alkyl group; $X^1$ is a benzene ring, hydroxyl benzene ring, naphthalene ring or hydroxyl naphthalene ring each of which may be substituted with an alkyl group; Y is a benzene ring, hydroxyl benzene ring, or a biphenyl ring each of which may be substituted with an alkyl group; and j and k are each independently a number of 1 to 15 as an average value,

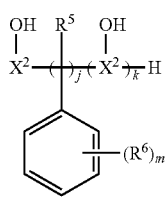
(2)

wherein $R^5$ is hydrogen atom or an alkyl group; $R^6$ is hydrogen atom, an alkyl group, or a thioalkyl group; $X^2$ is a benzene ring or naphthalene ring each of which may be substituted with an alkyl group; j and k are each a number of 1 to 15 as an average value; and m is an integer of 1 to 5.

When m is 2 to 5 in formula (2), it is not necessary that plural R6s are same but each independently may be a group selected from hydrogen atom, an alkyl group, or a thioalkyl group.

For the phenolic curing agent represented by formula (1) and (2), arrangement of each unit in parentheses may be random as long as satisfying the condition that j and k is a number of 1 to 15 as an average value. It is not necessary that each unit links between the same units successionally, but each unit can link together alternately or randomly.

With regard to the alkyl, group, an alkyl group having 1 to 3 carbon(s) is preferred and methyl group is particularly preferred. With regard to the thioalkyl group, an alkyl group having 1 to 3 carbon(s) is preferred and thiomethyl group is particularly preferred.

Furthermore, with regard to "the phenol type curing agent in which an average hydroxyl group amount in a molecule ((the total number of hydroxyl groups)/(the total number of benzene rings)) (P) is 0<P<1", a phenol type curing agent represented by formula (1') or (2') is preferred.

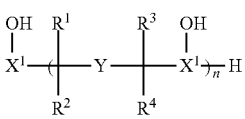
(1')

wherein $R^1$ to $R^4$ are each independently hydrogen atom or an alkyl group; $X^1$ is a benzene ring, hydroxyl benzene ring, naphthalene ring or hydroxyl naphthalene ring each of which may be substituted with an alkyl group; Y is a benzene ring, hydroxyl benzene ring, or a biphenyl ring each of which may be substituted with an alkyl group; and n is a number of 1 to 15 as an average value,

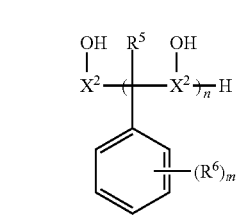
(2')

wherein $R^5$ is hydrogen atom or an alkyl group; $R^6$ is hydrogen atom, an alkyl group, or a thioalkyl group; $X^2$ is a benzene ring or naphthalene ring each of which may be substituted with an alkyl group; n is a number of 1 to 15 as an average value; and m is an integer of 1 to 5.

When m is 2 to 5 in formula (2'), it is not necessary that plural R6s are same but each independently may be a group selected from hydrogen atom, an alkyl group, or a thioalkyl group.

With regard to the alkyl group, an alkyl group having 1 to 3 carbon(s) is preferred and methyl group is particularly preferred. With regard to the thioalkyl group, an alkyl group having 1 to 3 carbon(s) is preferred and thiomethyl group is particularly preferred.

Phenol type curing agents of represented by formulae (3) to (7) are particularly preferred.

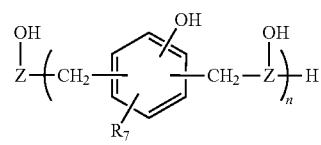
(3)

wherein $R^7$ is hydrogen atom or methyl group; Z is naphthalene ring; and n is a number of 1 to 15 as an average value;

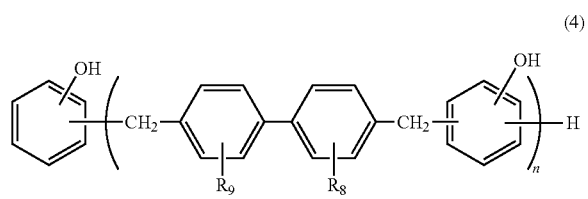
(4)

wherein $R^8$ and $R^9$ are each independently hydrogen atom or methyl group; and n is a number of 1 to 15 as an average value;

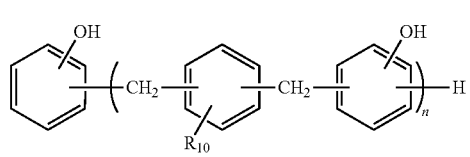
(5)

wherein $R^{10}$ is hydrogen atom or methyl group; and n is a number of 1 to 15 as an average value;

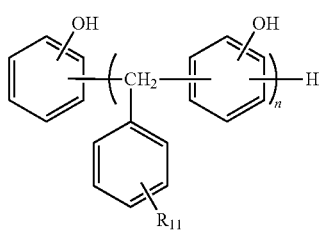

(6)

wherein $R^{11}$ is hydrogen atom, methyl group, or thiomethyl group; and n is a number of 1 to 15 as an average value;

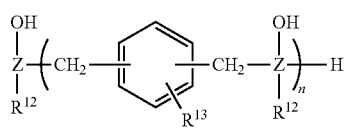

(7)

wherein R12 is a hydrogen atom, a methyl group or hydroxyl group, R13 is a hydrogen atom or a methyl group, Z is a naphthalene ring, n is a number of 1 to 15 as an average value.

Preferred specific examples of the phenol type curing agent are as follows. Thus, with regard to the phenol type curing agent represented by the formula (3), its examples are NHN (Z: naphthalene ring, R7: methyl group, average amount of hydroxyl group: ⅗~⅔, see figure below) and CBN (Z: naphthalene ring, R7: methyl group, average amount of hydroxyl group: ⅗~⅔, see figure below), both being manufactured by Nippon Kayaku Co., Ltd. With regard to the phenol type curing agent represented by formula (4), its examples are GPH103 (R8 and R9: hydrogen atom, average amount of hydroxyl group: ⅓-½) manufactured by Nippon Kayaku Co., Ltd. and MEH7851 (R8 and R9: hydrogen atom, average amount of hydroxyl group: ⅓-½) of Meiwa Plastic Industries, Ltd. With regard to the phenol type curing agent represented by formula (5), its examples include MEH7800 (R10: hydrogen atom, average amount of hydroxyl group: ⅓-½) manufactured by Meiwa Plastic Industries, Ltd. and XL225 (R10: hydrogen atom, average amount of hydroxyl group: ⅓~½) manufactured by Mitsui Chemicals, Inc. With regard to the phenol type curing agent represented by formula (6), its examples are YLH1027 (R10: hydrogen atom, average amount of hydroxyl group: ⅓~½) and YLH1110L (R11: thiomethyl group, average amount of hydroxyl group: ⅓~½) manufactured by Japan Epoxy Resins Co., Ltd. With regard to the phenol type curing agent represented by the formula (7), its examples are SN170, SN180, SN190 (R12 and R13: hydrogen atoms, average amount of hydroxyl group: ⅓~⅖, see figure below, softening points are 70 C.°, 80 C.°, 90 C.° independently), SN475, SN485, SN495 (R12 and R13: hydrogen atoms, average amount of hydroxyl group: ⅓~⅖, see figure below, softening points are 75 C.°, 85 C.°, 95 C.° independently), SN375 and SN395 (R12: hydroxyl group, R13: hydrogen atom, average amount of hydroxyl group: ⅔~⅘, see figure below, softening points are 75 C.°, 95 C.° independently) manufactured by Tohto Kasei Co., Ltd. In the present invention, the phenol type curing agent of component (B) may be used either solely or two or more thereof may be used jointly.

SN170, SN180, SN190

SN475, SN485, SN495

SN375, SN395

In the resin composition of the present invention, it is also possible to compound a phenol type curing agent which is other than the above mentioned phenol type curing agent (B) as such. In that case, it is preferred that not less than 50% by mass of the total curing agents of a phenol type in the composition is the phenol type curing agent (B), more preferably not less than 70% by mass and, particularly preferably, not less than 90% by mass, for fully achieving the advantages of the present invention.

In the present invention, the amount of the phenol type curing agent in the resin composition (the whole amount of the phenol type curing agent (B) when only the phenol type curing agent (B) is used or, when the phenol type curing agent (B) is used together with a phenol type curing agent which is other than the phenol type curing agent (B), their amount) is usually preferred so as to make the ratio of the total number of the epoxy groups existing in the resin composition to the total number of phenolic hydroxyl groups of the phenol type curing agent 1:0.5 to 1.5 and, more preferably, the ratio is made 1:0.5 to 1.0. Incidentally, the total number of the epoxy groups existing in the resin composition are the values calculated in such as manner that the value obtained by dividing the solid mass of each epoxy resin by the epoxy equivalent weights is totaled up for all epoxy resins while the total number of the phenolic hydroxyl groups of a phenol type curing agent are the values calculated in such as manner that the value obtained by dividing the solid mass of each curing agent of a phenol type by the phenolic hydroxyl group equivalents is totaled up for all curing agent of a phenol type. When the amount of the phenol type curing agent is out of such a preferred range, there may the case where heat resistance of a cured product prepared by curing of the resin composition is insufficient.

Phenoxy Resin of the Component (C):

There is no particular limitation for the phenoxy resin in the present invention but known phenoxy resins may be used. As a result of compounding of a phenoxy resin, flexibility of the adhesive film is able to be also enhanced. When the nonvolatile component of the epoxy resin composition is 100% by mass, the amount of the phenoxy resin is preferred to be within a range of 3 to 30% by mass. Specific examples of the phenoxy resin includes FX 280 and FX 293 manufactured by Tohto Kasei Co., Ltd., and YX 8100, YX 6954 (YL 6954) and YL 6974 manufactured by Japan Epoxy Resins Co., Ltd.

Rubber Particles of the Component (D):

The rubber particles in the present invention are not soluble even in an organic solvent used for the preparation of an epoxy resin composition and are also immiscible with components in the resin composition such as epoxy resin. Accordingly, the rubber particles in the present invention are present in a dispersed state in a varnish of the epoxy resin composition. Such rubber particles are usually prepared by making the molecular weight of the rubber component high to such a level that they are not dissolved in organic solvents and resin and by making into particles. For example, a rubber component which is soluble in a solvent and is miscible with other component such as epoxy resin in the resin composition is compounded, roughness after the roughening treatment greatly increases and heat resistance of the cured product also lowers.

Preferred examples of the rubber particles in the present invention include core-shell type rubber particles, cross-linked acrylonitrile butadiene rubber particles, cross-linked styrene butadiene rubber particles, and acrylate rubber particles. Core-shell type rubber particles are rubber particles where the particle has a core layer and a shell layer and its examples are a two-layered structure where the shell layer which is an outer layer is glass-like polymer and the core layer which is an inner layer is a rubber-like polymer and a three-layered structure where the shell layer which is an outer layer is a glass-like polymer, an intermediate layer is a rubber-like polymer and the core layer is a glass-like polymer. The glass layer is constituted, for example, from a polymer of methyl methacrylate while the rubber-like polymer layer is constituted, for example, from a polymer of butyl acrylate (butyl rubber). Specific examples of the core-shell type rubber particles include Staphyloid AC 3832 and AC 3816 N (trade name; Ganz Chemical Co., Ltd.) and Metablen KW-4426 (trade name; Mitsubishi Rayon Co., Ltd.). Specific examples of the acrylonitrile butadiene rubber (NBR) particles include XER-91 (average particle size: 0.5 μm; manufactured by JSR Co.), etc. Specific examples of the styrene butadiene rubber (SBR) particles include XSK-500 (average particle size: 0.5 μm; manufactured by JSR Co.), etc. Specific examples of the acrylate rubber particles include Metablen W300A (average particle size: 0.1 μm) and W450A (average particle size: 0.2 μm) (manufactured by Mitsubishi Rayon Co., Ltd.). Incidentally, those rubber particles are able to bestow the effects such as enhancing the mechanical strength of cured product, mitigating the stress of the cured product, etc.

An average particles size of the rubber particles to be compounded is preferably within a range of 0.005 to 1 μm and, more preferably, within a range of 0.2 to 0.6 μm. Average particle size of the rubber particles in the present invention is able to be measured using a dynamic light scattering method. The measurement is carried out, for example, in such a manner that rubber particles are uniformly dispersed by an ultrasonic wave, etc. in an appropriate organic solvent, particle size distribution of the rubber particles are prepared on the basis of mass using an FPRA-1000 (manufactured by Otsuka Electronics Co., Ltd.) and a median diameter thereof is adopted as an average particle size.

Although the compounding rate to the resin composition (nonvolatile substance: 100% by mass) when the rubber particles are compounded may vary depending upon the characteristic demanded for the resin composition, it is preferably 1 to 10% by mass and, more preferably, 2 to 5% by mass.

The epoxy resin composition of the present invention may also contain an inorganic filler with an object of, for example, lowering its thermal expansion rate. Examples of the inorganic filler includes silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate and, among them, silica is particularly suitable. An average particle size of the inorganic filler is preferably not more than 1 μm, more preferably not more than 0.8 μm and, particularly preferably, not more than 0.7 μm. When an average particle size is more than 1 μm, there is a tendency that peel strength of a conductor layer formed by plating lowers. When an average particle size of the inorganic filler is too small, there is a tendency that, when the epoxy resin composition is made into resin varnish, the viscosity of the varnish rises and handling property is lowered, whereby the average particle size is preferred to be not less than 0.05 μm. Incidentally, in order to enhance the resistance to humidity, the inorganic filler is preferred to be subjected to a surface treatment with a surface treating agent such as a silane coupling agent.

An average particle size of the above inorganic filler is able to be measured by laser diffraction and scattering method based on a Mie scattering theory. To be more specific, the measurement is conducted in such a manner that particle size distribution of the inorganic filler is prepared based on volume by a particle size measuring apparatus of a laser diffraction type and the median diameter thereof is adopted as an average particle size. With regard to a sample to be measured, that where the inorganic filler is dispersed in water by means of ultrasonic wave is able to be preferably used. With regard to the particle size measuring apparatus of a laser diffraction type, LA-500 manufactured by Horiba Ltd. may, for example, be used.

Although the amount to the resin composition (nonvolatile matter: 100% by mass) when the inorganic filler is compounded varies depending upon the characteristic demanded for the resin composition, it is preferably 10 to 75% by mass, more preferably 20 to 50% by mass and, particularly preferably, 20 to 40% by mass, of inorganic filler, based on the total mass of the resin composition.

The epoxy resin composition of the present invention may contain a curing promoter with an object of adjustment of curing time, etc. Examples of the curing promoter are an organic phosphine compound, an imidazole compound, an amine adduct compound, and a tertiary amine compound. Specific examples of the organic phosphine compound are TPP, TPP-K, TPP-S, and TPTP-S (trade names; manufactured by Hokko Chemical Industry Co., Ltd.). Specific examples of the imidazole compound are Curesol 2MZ, 2E4MZ, C11Z, C11Z-CN, C11Z-CNS, C11Z-A, 2MZ-OK, 2MA-OK, and 2-PHZ (trade names; manufactured by Shikoku Chemicals Co.). Specific examples of the amine adduct compound are Novacure (trade name; manufactured by Asahi Kasei Co.) and Fujicure (trade name; Manufactured by Fuji Kasei Kogyo Co., Ltd.). Specific examples of the tertiary amine compound are DBU (1,8-diazabicyelo[5,4,0]undec-7-ene), etc. In the epoxy resin composition of the present invention, the amount of the curing promoter when the total amount of the epoxy resin and phenolic curing agent contained in the epoxy resin composition is 100% by mass (solid), it is usually used within a range of 0.1 to 5% by mass, based on the total mass of the composition.

In order to bestow flame retarding property, the epoxy resin composition of the present invention may contain a flame retardant. Examples of the flame retardant are a flame retardant of an organic phosphorus type, a phosphorus compound containing an organic nitrogen, a nitrogen compound, a flame retardant of a silicone type, and a metal hydroxide.

Examples of the flame retardant of an organic phosphorus type are a phosphine compound such as HCA, HCA-HQ, and HCA-NQ manufactured by Sanko Co., Ltd.; a phosphate compound such as Reofos 30, 50, 65, 90, 110, TPP, RPD, BAPP, CPD, TCP, TXP, TBP, TOP, KP140, and TIBP (all are manufactured by Ajinomoto Fine-Techno Co, Inc), PPQ manufactured by Hokko Chemical Industry Co., Ltd., OP 930 manufactured by Clariant (Japan) K.K., and PX 200 manufactured by Daihachi Chemical Industry Co., Ltd., a phosphorus-containing epoxy resin such as FX 289 and FX 310 manufactured by Tohto Kasei Co., Ltd., and a phosphorus-containing phenoxy resin such as ERF 001 manufactured by Tohto Kasei Co., Ltd.

With regard to the phosphorus compound containing an organic nitrogen, its examples are a phosphate imide compound such as SP 670 and SP 703 manufactured by Shikoku Chemicals Co. and a phosphazene compound such as SPB 100 and SPE 100 manufactured by Otsuka Chemical Co., Ltd.

With regard to the metal hydroxide, its examples are magnesium hydroxide such as UD 65, UD 650, and UD 653 manufactured by Ube Material Industries, Ltd. and aluminum hydroxide such as B-30, B-325, B-315, B-308, B-303, and UFH-20 manufactured by Tomoe Engineering Co., Ltd.

When the flame retardant is compounded, its amount to the resin composition (nonvolatile matter: 100% by mass) is preferably not more than 20% by mass and, more preferably, not more than 15% by mass, based on the total mass of the resin composition.

The epoxy resin composition of the present invention may contain a resin additive other than the above-mentioned ones within such an extent that the advantages of the present invention are achieved. Examples of the resin additive are an organic filler such as silicone powder, Nylon powder, and fluorine powder; a thickener such as Orben and Benton; a defoaming agent or leveling agent of a silicone type, a fluorine type, or a polymer type; an agent for giving adhesiveness such as that of an imidazole type, a thiazole type, or a triazole type and a silane coupling agent; and a coloring agent such as Phthalocyanine Blue, Phthalocyanine Green, Iodine Green, Disazo Yellow, and carbon black.

The resin composition of the present invention may be made into an adhesive film for a multi-layered printed board by applying it onto a support film followed by forming a resin composition layer or may be made into a prepreg for interlayer insulation layer for a multi-layer printed board by impregnating the resin composition into a sheet-shaped reinforcing substrate comprising fiber. Although the resin composition of the present invention may form an insulating layer by application on a circuit substrate, it is usually used for the formation of an insulating layer in a form of an adhesive film or a prepreg in industry.

The adhesive film of the present invention may be manufactured by a method known bu persons skilled in the art such as by such a manner that a resin varnish where a resin composition is dissolved in an organic solvent is prepared, the resin varnish is applied using a supporting film as a support and the organic solvent is dried by heating or by blowing of hot air to obtain a resin composition layer.

Examples of the organic solvent are ketones such as acetone, methyl ethyl ketone, and cylohexanone; acetates such as ethyl acetate, butyl acetate, cellosolve acetate, propylene glycol monomethyl ether acetate, and carbitol acetate; carbitols such as Cellosolve and butyl carbitol; aromatic hydrocarbons such as toluene and xylene; dimethyl formamide; dimethyl acetamide; and N-methylpyrrolidone. Two or more organic solvents may be combined and used.

Although there is no particular limitation for the drying condition, the drying is typically carried out in such a manner that the amount of the organic solvent in the resin composition layer becomes usually not more than 10% by mass and, preferably, not more than 5% by mass. Although it may vary depending upon the amount of the organic solvent in the varnish, varnish containing, for example, 30 to 60% by mass of an organic solvent may be dried at 50 to 150° C. for about 3 to 10 minutes. Persons skilled in the art are able to appropriately set up a preferred drying condition by a simple experiment.

The thickness of the resin composition layer formed by an adhesive film is usually made not less than the thickness of the conductor layer. Since the thickness of the conductor layer of the circuit substrate is usually within a range of 5 to 70 μm, it is preferred that the thickness of the resin composition layer is 10 to 100 μm. The resin composition layer may be protected with a protective film which will be mentioned later. By protecting with a protective film, adhesion of dust, etc. or scratch of the surface of the resin composition is able to be prevented.

Examples of the support film and the protective film in the present invention are polyolefins such as polyethylene, polypropylene, and polyvinyl chloride; polyesters such as polyethylene terephthalate (hereinafter, may be abbreviated as "PET") and polyethylene naphthalate; polycarbonate; polyimide; a releasing paper; and metal foils such as copper foil and aluminum foil. The support film and the protective film may be those which were subjected to a matting treatment, a corona treatment, and a releasing treatment.

Although there is no particular limitation for thickness of the support film, it is usually used within a range of 10 to 150 μm and, preferably, 25 to 50 μm. Although there is no particular limitation for the thickness of the protective film as well, it is usually used within a range of 1 to 40 μm and, preferably, 10 to 30 μm. As will be mentioned later, a support film used as a support in the manufacturing step of the adhesive film may be used as a protective film for the protection of the surface of the resin composition.

The support film in the present invention is released after it is laminated to a circuit substrate or it is heated to cure to form an insulating layer. When an adhesive film is heated to cure and then a support film is released, adhesion of dust, etc. during the curing step is able to be prevented and, in addition, a surface smoothness of the insulating layer after curing is able to be enhanced. When the releasing is done after curing, a releasing treatment is usually conducted for the support film. Incidentally, it is preferred that the resin composition layer formed on a support film is formed in such a manner that the area of the layer is made smaller than the area of the support film. The adhesive film is able to be wound in a roll and then stored and preserved.

A method for the manufacture of a multi-layered printed board of the present invention using the adhesive film of the present invention will now be illustrated. When the resin composition layer is protected with a protective film, it is released and lamination is carried out on one or both side(s) of the circuit substrate so that the resin composition layer directly contacts the circuit substrate. In the adhesive film of the present invention, a method where lamination is conducted on the circuit substrate in vacuo by means of a vacuum lamination is advantageously used. Method for the lamination may be in a batch system or in a continuous system using a roll. It is also possible that, before conducting the lamination, the adhesive film and the circuit substrate are heated (pre-heated) if necessary.

With regard to the conditions for the lamination, it is preferred to make the temperature for adhesion with pressure (laminating temperature) 70 to 140° C., to make the pressure for adhesion with pressure 1 to 11 kgf/cm$^2$ (9.8×10$^4$ to 107.9× 10$^4$ N/m$^2$) and to laminate in vacuo where air pressure is not higher than 20 mmHg (26.7 hPa).

A vacuum lamination is able to be carried out using a commercially available vacuum laminator. Examples of the commercially available vacuum laminator are Vacuum Applicator manufactured by Nichigo Morton Co., Ltd., Vacuum Pressure Laminator manufactured by Meiki Co., Ltd., Dry Coater of Roll Type manufactured by Hitachi Plant Technologies, Ltd., and Vacuum Laminator manufactured by Hitachi AIC Inc.

The circuit substrate in the present invention is that in which a pattern-processed conductor layer (circuit) is formed on one or both side(s) of a substrate such as glass epoxy, metal substrate, polyester substrate, polyimide substrate, BT resin substrate, and a thermo-setting polyphenylene ether substrate. A multi-layered printed board in which a conductor layer and an insulating layer are layered alternately and one or both sides thereof is/are subjected to a pattern processing to give a conductor layer (circuit) is also covered by the circuit substrate of the present invention. When the surface of the conductor circuit layer is previously subjected to a roughening treatment by, for example, a blackening treatment, it is preferred in view of adhesiveness of the insulating layer to the circuit substrate.

After the adhesive film is laminated to the circuit substrate as such and the support film is released in case it is to be released, a thermosetting is conducted whereupon an insulating layer is able to be formed on the circuit substrate. The condition for the heating/curing is selected from the range of 150 to 220° C. and 20 to 180 minutes and, more preferably, at 160 to 200° C. for 30 to 120 minutes.

After the insulating layer is formed, a support film is released in case it is not released before the curing. Then a hole is made on the insulating layer formed on the circuit substrate to form a via hole and a through hole. Making the hole is able to be carried out by a conventional means such as drill, laser, or plasma or, if necessary, such means may be combined and a means by laser such as carbonic acid gas laser or YAG laser is the most common method.

After that, the insulating layer surface is subjected to a roughening treatment. Usually, the roughening treatment in the present invention is preferred to be conducting by a wet roughening method using an oxidizing agent. Examples of the oxidizing agent are permanganate (such as potassium permanganate and sodium permanganate), bichromate, ozone, hydrogen peroxide/sulfuric acid, and nitric acid. Preferred one is an oxidizing agent which is commonly used for roughening of an insulating layer in the manufacture of multi-layered printed board in a built-up process. It is preferred to conduct a roughening using an alkaline permanganate solution (such as an aqueous sodium hydroxide solution of potassium permanganate or sodium permanganate).

In view of formation of a superfine wiring, the roughness of the roughened surface where the insulating layer surface is subjected to a roughening treatment is preferably not more than 0.5 µm or, more preferably, not more than 0.35 µm in term of Ra value.

After that, by a method where nonelectrolytic plating and electrolytic plating are combined, a conductor layer is formed on the surface of the resin composition where an uneven anchor was formed by a roughening treatment. It is also possible to form a conductor layer only by means of nonelectrolytic plating after forming a plating resist which is a reversed pattern to the conductor layer. It is further possible that, after formation of a conductor layer, an annealing treatment is conducted at 150 to 200° C. for 20 to 90 minutes whereby the peel strength of the conductor layer is further enhanced and stabilized. According to the present invention, it is possible to achieve a peel strength of a conductor layer which is preferred as a multi-layered printed board. Peel strength which is preferred to the multi-layered printed board is not less than 0.6 kgf/cm.

With regard to a method for forming the circuit by subjecting the conductor layer to a pattern processing, it is possible to use a subtractive method, a semi-additive method, etc. which are known among persons skilled in the art.

The prepreg of the present invention is able to be manufactured in such a manner that the resin composition of the present invention is impregnated in a sheet-shaped reinforcing substrate comprising fiber by a hot-melt method or a solvent method and then semi-cured by heating. Thus, it is possible to manufacture of prepreg in such state that the resin composition of the present invention is impregnated in a sheet-form reinforcing substance comprising fiber.

A sheet-form reinforcing substrate comprising fiber, that which has been commonly used as a fiber for prepreg such as glass cloth and aramid fiber may be used.

A hot-melt method is a method where the resin is not dissolved in an organic solvent but is once coated on a coated paper having a good releasing ability with resin and then laminated onto a sheet-form reinforcing substrate or directly coated by a die coater to manufacture a prepreg. A solvent method is a method where, like in the case of an adhesive film, a sheet-form reinforcing substrate is impregnated in a resin varnish where the resin is dissolved in an organic solvent so that the resin varnish is impregnated in the sheet-form reinforcing substrate followed by drying.

Now a method for the manufacture of the multi-layered printed board of the present invention using the prepreg of the present invention will be illustrated. One or, if necessary, several sheet(s) of the prepreg of the present invention is/are layered on the circuit substrate, a metal plate is sandwiched via a releasing film and a press layering is carried out under the condition of heating and pressurizing. It is preferred to conduct a molding at the pressure of preferably 5 to 40 kgf/cm$^2$ (49×10$^4$ to 392×10$^4$ N/m$^2$) and the temperature of preferably 120 to 200° C. for 20 to 100 minutes. Like in the case of an adhesive film, it is also possible that lamination is conducted onto the circuit substrate by a vacuum lamination method and then curing is done by heating. After that, the surface of the prepreg cured is roughened by an oxidizing agent by the same method as mentioned before and then a conductor layer is formed by means of plating whereupon the multi-layered printed board is able to be manufactured.

Other features of the invention will become apparent in the course of the following descriptions of exemplary embodiments which are given for illustration of the invention and are not intended to be limiting thereof.

EXAMPLES

In the following examples, the term "part(s)" in the following descriptions means "part(s) by mass".

Example 1

Liquid epoxy resin of a bisphenol A type (epoxy equivalent weight: 180; "Epikote 828 EL" manufactured by Japan Epoxy Resins Co., Ltd.) (28 parts) and 28 parts of tetrafunctional epoxy resin of a naphthalene type (epoxy equivalent weight: 163; "EXA-4700" manufactured by Dainippon Ink and Chemicals, Inc.) were dissolved in 15 parts of methyl ethyl ketone (hereinafter, abbreviated as MEK) and 15 parts of cyclohexanone by heating with stirring. Then 110 parts of an MEK solution of novolak resin of a naphthalene structure which was a phenolic curing agent ("SN-485" manufactured by Tohto Kasei Co., Ltd.; phenolic hydroxy group equivalent: 215; average hydroxyl group amount in a molecule: $1/3 \sim 2/5$) in solid amount of 50%, 0.1 part of a curing catalyst ("2E4MZ" manufactured by Shikoku Chemicals Co.), 77 parts of spherical silica (average particle size: 0.5 µm; "SOC2" manufactured by Admatechs Co., Ltd.), 9 parts of core-shell rubber particles (average particle size: 0.5µ; "AC-3816N" manufactured by Ganz Chemical Co., Ltd.) and 27 parts of phenoxy resin varnish (a mixed solution of MEK and cyclohexanone where nonvolatile matter was 30% by mass; "YL6954BH30" manufactured by Japan Epoxy Resins Co., Ltd.; glass transition temperature: 130° C.) were mixed therewith followed by uniformly dispersing using a high-speed rotary mixer to prepare a resin varnish (amount of inorganic filler to the nonvolatile matter of the resin varnish was 38% by mass and the ratio of (total numbers of phenolic hydroxyl group) to (total numbers of epoxy group) was 0.78). After that, the resin varnish was applied by a die coater on a polyethylene terephthalate (thickness: 38 µm; hereinafter, abbreviated as PET) to make the resin thickness after drying 40 µm and dried at 80 to 120° C. (100° C. in average) for 6 minutes (residual solvent amount: about 1% by mass). Then a polypropylene film of 15 µm thickness was adhered to the surface of the resin composition and, at the same time, wound in a roll. An adhesive film in a roll shape was slit in a width of 507 mm and an adhesive film in a sheet form in a size of 507×336 mm was prepared therefrom.

Example 2

Liquid epoxy resin of a bisphenol A type (epoxy equivalent weight: 180; "Epikote 828 EL" manufactured by Japan Epoxy Resins Co., Ltd.) (28 parts) and 28 parts of tetrafunctional epoxy resin of a naphthalene type (epoxy equivalent weight: 163; "EXA-4700" manufactured by Dainippon Ink and Chemicals, Inc.) were dissolved in 15 parts of MEK and 15 parts of cyclohexanone by heating with stirring. Then 75 parts of an MEK solution of novolak resin which was a phenolic curing agent containing thiomethyl group ("YLH-1110L" manufactured by Japan Epoxy Resins Co., Ltd.; phenolic hydroxy group equivalent: 168; average hydroxyl group amount in a molecule: $1/3 \sim 1/2$) in solid amount of 60%, 0.1 part of a curing catalyst ("2E4MZ" manufactured by Shikoku Chemicals Co.), 72 parts of spherical silica (average particle size: 0.5 µm; "SOC2" manufactured by Admatechs Co., Ltd.), 9 parts of core-shell rubber particles (average particle size: 0.5µ; "AC-3816N" manufactured by Ganz Chemical Co., Ltd.) and 27 parts of phenoxy resin varnish (a mixed solution of MEK and cyclohexanone where nonvolatile matter was 30% by mass; "YL6954BH30" manufactured by Japan Epoxy Resins Co., Ltd.; glass transition temperature: 130° C.) were mixed therewith followed by uniformly dispersing using a high-speed rotary mixer to prepare a resin varnish (amount of inorganic filler to the nonvolatile matter of the resin varnish was 38% by mass and the ratio of (total numbers of phenolic hydroxyl group) to (total numbers of epoxy group) was 0.82). A sheet-form adhesive film was prepared by the same method as in Example 1.

Example 3

Liquid epoxy resin of a bisphenol A type (epoxy equivalent weight: 180; "Epikote 828 EL" manufactured by Japan Epoxy Resins Co., Ltd.) (28 parts) and 28 parts of tetrafunctional epoxy resin of a naphthalene type (epoxy equivalent weight: 163; "EXA-4700" manufactured by Dainippon Ink and Chemicals, Inc.) were dissolved in 15 parts of MEK and 15 parts of cyclohexanone by heating with stirring. Then 65 parts of an MEK solution of novolak resin which was a phenolic curing agent ("YLH-1027" manufactured by Japan Epoxy Resins Co., Ltd.; phenolic hydroxy group equivalent: 120; average hydroxyl group amount in a molecule: $1/3 \sim 1/2$) in solid amount of 60%, 0.1 part of a curing catalyst ("2E4MZ" manufactured by Shikoku Chemicals Co.), 67 parts of spherical silica (average particle size: 0.5 µm; "SOC2" manufactured by Admatechs Co., Ltd.), 8 parts of acrylate rubber particles (average particle size: 0.2µ; "W-450A" manufactured by Mitsubishi Rayon Co., Ltd.) and 27 parts of phenoxy resin varnish (a mixed solution of MEK and cyclohexanone where nonvolatile matter was 30% by mass; "YL6954BH30" manufactured by Japan Epoxy Resins Co., Ltd.; glass transition temperature: 130° C.) were mixed therewith followed by uniformly dispersing using a high-speed rotary mixer to prepare a resin varnish (amount of inorganic filler to the nonvolatile matter of the resin varnish was 38% by mass and the ratio of (total numbers of phenolic hydroxyl group) to (total numbers of epoxy group) was 0.99). A sheet-form adhesive film was prepared by the same method as in Example 1.

Example 4

Liquid epoxy resin of a bisphenol A type (epoxy equivalent weight: 180; "Epikote 828 EL" manufactured by Japan Epoxy Resins Co., Ltd.) (28 parts) and 28 parts of tetrafunctional epoxy resin of a naphthalene type (epoxy equivalent weight: 163; "EXA-4700" manufactured by Dainippon Ink and Chemicals, Inc.) were dissolved in 15 parts of MEK and 15 parts of cyclohexanone by heating with stirring. Then 120 parts of an MEK solution of novolak resin of a naphthalene structure which was a phenolic curing agent ("GPH-103" manufactured by Nippon Kayaku Co., Ltd.; phenolic hydroxy group equivalent: 231; average hydroxyl group amount in a molecule: $1/3 \sim 1/2$) in solid amount of 50%, 0.1 part of a curing catalyst ("2E4MZ" manufactured by Shikoku Chemicals Co.), 80 parts of spherical silica (average particle size: 0.5 µm; "SOC2" manufactured by Admatechs Co., Ltd.), 9 parts of acrylate rubber particles (average particle size: 0.2µ; "W-450A" manufactured by Mitsubishi Rayon Co., Ltd.) and 27 parts of phenoxy resin varnish (a mixed solution of MEK and cyclohexanone where nonvolatile matter was 30% by mass; "YL6954BH30" manufactured by Japan Epoxy Resins Co., Ltd.; glass transition temperature: 130° C.) were mixed therewith followed by uniformly dispersing using a high-speed rotary mixer to prepare a resin varnish (amount of inorganic filler to the nonvolatile matter of the resin varnish was 38% by mass and the ratio of (total numbers of phenolic hydroxyl group) to (total numbers of epoxy group) was 0.79). A sheet-form adhesive film was prepared by the same method as in Example 1.

Example 5

Liquid epoxy resin of a bisphenol A type (epoxy equivalent weight: 180; "Epikote 828 EL" manufactured by Japan Epoxy Resins Co., Ltd.) (28 parts) and 28 parts of tetrafunctional epoxy resin of a naphthalene type (epoxy equivalent weight: 163; "EXA-4700" manufactured by Dainippon Ink and Chemicals, Inc.) were dissolved in 15 parts of MEK and 15 parts of cyclohexanone by heating with stirring. Then 75 parts of an MEK solution of novolak resin of a naphthalene structure which was a phenolic curing agent ("NHN" manufactured by Nippon Kayaku Co., Ltd.; phenolic hydroxy group equivalent: 143; average hydroxyl group amount in a molecule: $3/5 \sim 2/3$) in solid amount of 50%, 0.1 part of a curing catalyst ("2E4MZ" manufactured by Shikoku Chemicals Co.), 67 parts of spherical silica (average particle size: 0.5 μm; "SOC2" manufactured by Admatechs Co., Ltd.), 8 parts of acrylate rubber particles (average particle size: 0.2μ; "W-450A" manufactured by Mitsubishi Rayon Co., Ltd.) and 27 parts of phenoxy resin varnish (a mixed solution of MEK and cyclohexanone where nonvolatile matter was 30% by mass; "YL6954BH30" manufactured by Japan Epoxy Resins Co., Ltd.; glass transition temperature: 130° C.) were mixed therewith followed by uniformly dispersing using a high-speed rotary mixer to prepare a resin varnish (amount of inorganic filler to the nonvolatile matter of the resin varnish was 38% by mass and the ratio of (total numbers of phenolic hydroxyl group) to (total numbers of epoxy group) was 0.80). A sheet-form adhesive film was prepared by the same method as in Example 1.

Example 6

Liquid bisphenol A epoxy resin (epoxy equivalent weight: 180; "Epikote828EL" manufactured by Japan Epoxy Resins Co., Ltd., (28 parts) and 28 parts of tetrafunctional epoxy resin of a naphthalene type (epoxy equivalent weight: 163; "EXA-4700" manufactured by Dainippon Ink and Chemicals Inc.) were dissolved in 15 parts of MEK and 15 parts of cyclohexanone by heating with stirring. Then 55 parts of an MEK solution of novolak resin of a naphthalene structure which was a phenolic curing agent ("SN395" manufactured by Tohto Kasei Co., Ltd.; phenolic hydroxyl group equivalent: 107, average hydroxyl group amount in molecule: $2/3 \sim 4/5$) in solid amount of 50%, 0.1 part of a curing catalyst ("2E4MZ" manufactured by Shikoku Chemicals Co.), 67 parts of spherical silica (average particle size: 0.5 μm; "SOC2" manufactured by Admatechs Co., Ltd.), 8 parts of acrylate rubber particles (average particle size; 0.2μ; "W-450A" manufactured by Mitsubishi Rayon Co., Ltd.) and 27 parts of phenoxy resin varnish (a mixed solution of MEK and cyclohexanone where nonvolatile matter was 30% by mass; "YL6954BH30" manufactured by Japan Epoxy Resins Co., Ltd.; glass transition temperature: 130° C.) were mixed therewith followed by uniformly dispersing using a high-speed rotary mixer to prepare a resin varnish (amount of inorganic filler to the nonvolatile matter of the resin varnish was 40% by mass and the ratio of (total numbers of phenolic hydroxyl group) to (total numbers of epoxy group) was 0.80). A sheet-form adhesive film was prepared by the same method as in Example 1.

Comparative Example 1

Liquid epoxy resin of a bisphenol A type (epoxy equivalent weight: 180; "Epikote 828 EL" manufactured by Japan Epoxy Resins Co., Ltd.) (28 parts) and 28 parts of tetrafunctional epoxy resin of a naphthalene type (epoxy equivalent weight: 163; "EXA-4700" manufactured by Dainippon Ink and Chemicals, Inc.) were dissolved in 15 parts of MEK and 15 parts of cyclohexanone by heating with stirring. Then 50 parts of an MEK solution of novolak resin which was a phenolic curing agent ("LA 7052" manufactured by Dainippon Ink and Chemicals, Inc., represented by formula (8); phenolic hydroxy group equivalent: 120; average hydroxyl group amount in a molecule: 1/1) in solid amount of 60% by mass, 0.1 part of a curing catalyst ("2E4MZ" manufactured by Shikoku Chemicals Co.), 62 parts of spherical silica (average particle size: 0.5 μm; "SOC2" manufactured by Admatechs Co., Ltd.), 8 parts of acrylate rubber particles (average particle size: 0.2μ; "W-450A" manufactured by Mitsubishi Rayon Co., Ltd.) and 27 parts of phenoxy resin varnish (a mixed solution of MEK and cyclohexanone where nonvolatile matter was 30% by mass; "YL6954BH30" manufactured by Japan Epoxy Resins Co., Ltd.; glass transition temperature: 130° C.) were mixed therewith followed by uniformly dispersing using a high-speed rotary mixer to prepare a resin varnish (amount of inorganic filler to the nonvolatile matter of the resin varnish was 38% by mass and the ratio of (total numbers of phenolic hydroxyl group) to (total numbers of epoxy group) was 0.76). A sheet-form adhesive film was prepared by the same method as in Example 1.

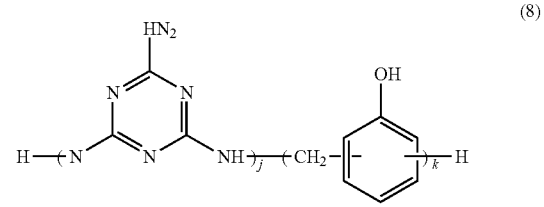

(8)

Comparative Example 2

Liquid epoxy resin of a bisphenol A type (epoxy equivalent weight: 180; "Epikote 828 EL" manufactured by Japan Epoxy Resins Co., Ltd.) (28 parts) and 28 parts of tetrafunctional epoxy resin of a naphthalene type (epoxy equivalent weight: 163; "EXA-4700" manufactured by Dainippon Ink and Chemicals, Inc.) were dissolved in 15 parts of MEK and 15 parts of cyclohexanone by heating with stirring. Then 45 parts of an MEK solution of novolak resin which was a phenolic curing agent ("TD 2090-60M" manufactured by Dainippon Ink and Chemicals, Inc., represented by formula (9); phenolic hydroxy group equivalent: 105; average hydroxyl group amount in a molecule: 1/1) in solid amount of 60% by mass, 0.1 part of a curing catalyst ("2E4MZ" manufactured by Shikoku Chemicals Co.), 60 parts of spherical silica (average particle size: 0.5 μm; "SOC2" manufactured by Admatechs Co., Ltd.), 7 parts of acrylate rubber particles (average particle size: 0.2μ; "W-450A" manufactured by Mitsubishi Rayon Co., Ltd.) and 27 parts of phenoxy resin varnish (a mixed solution of MEK and cyclohexanone where nonvolatile matter was 30% by mass; "YL6954BH30" manufactured by Japan Epoxy Resins Co., Ltd.; glass transition temperature: 130° C.) were mixed therewith followed by uniformly dispersing using a high-speed rotary mixer to prepare a resin varnish (amount of inorganic filler to the nonvolatile matter of the resin varnish was 38% by mass and the ratio of (total numbers of phenolic hydroxyl group) to (total numbers of epoxy group) was 0.79). A sheet-form adhesive film was prepared by the same method as in Example 1.

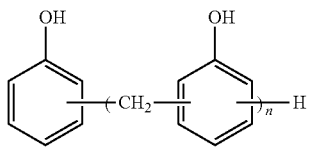

(9)

Comparative Example 3

Liquid epoxy resin of a bisphenol A type (epoxy equivalent weight: 180; "Epikote 828 EL" manufactured by Japan Epoxy Resins Co., Ltd.) (28 parts) and 28 parts of tetrafunctional epoxy resin of a naphthalene type (epoxy equivalent weight: 163; "EXA-4700" manufactured by Dainippon Ink and Chemicals, Inc.) were dissolved in 15 parts of MEK and 15 parts of cyclohexanone by heating with stirring. Then 110 parts of an MEK solution of novolak resin which was a phenolic curing agent in a naphthalene structure ("SN-485" manufactured by Tohto Kasei Co., Ltd.; phenolic hydroxy group equivalent: 215; average hydroxyl group amount in a molecule: ⅓~⅖) in solid amount of 50%, 0.1 part of a curing catalyst ("2E4MZ" manufactured by Shikoku Chemicals Co.), 72 parts of spherical silica (average particle size: 0.5 μm; "SOC2" manufactured by Admatechs Co., Ltd.), and 27 parts of phenoxy resin varnish (a mixed solution of MEK and cyclohexanone where nonvolatile matter was 30% by mass; "YL6954BH30" manufactured by Japan Epoxy Resins Co., Ltd.; glass transition temperature: 130° C.) were mixed therewith followed by uniformly dispersing using a high-speed rotary mixer to prepare a resin varnish (amount of inorganic filler to the nonvolatile matter of the resin varnish was 38% by mass and the ratio of (total numbers of phenolic hydroxyl group) to (total numbers of epoxy group) was 0.78). A sheet-form adhesive film was prepared by the same method as in Example 1.

Comparative Example 4

Liquid epoxy resin of a bisphenol A type (epoxy equivalent weight: 180; "Epikote 828 EL" manufactured by Japan Epoxy Resins Co., Ltd.) (28 parts) and 28 parts of tetrafunctional epoxy resin of a naphthalene type (epoxy equivalent weight: 163; "EXA-4700" manufactured by Dainippon Ink and Chemicals, Inc.) were dissolved in 15 parts of MEK and 15 parts of cyclohexanone by heating with stirring. Then 110 parts of an MEK solution of novolak resin which was a phenolic curing agent in a naphthalene structure ("SN-485" manufactured by Tohto Kasei Co., Ltd.; phenolic hydroxy group equivalent: 215; average hydroxyl group amount in a molecule: ⅓~⅖) in solid amount of 50%, 0.1 part of a curing catalyst ("2E4MZ" manufactured by Shikoku Chemicals Co.), 73 parts of spherical silica (average particle size: 0.5 μm; "SOC2" manufactured by Admatechs Co., Ltd.) and 9 parts of acrylate rubber particles (average particle size: 0.2μ; "W-450A" manufactured by Mitsubishi Rayon Co., Ltd.) were mixed therewith followed by uniformly dispersing using a high-speed rotary mixer to prepare a resin varnish (amount of inorganic filler to the nonvolatile matter of the resin varnish was 38% by mass and the ratio of (total numbers of phenolic hydroxyl group) to (total numbers of epoxy group) was 0.78). A sheet-form adhesive film was prepared by the same method as in Example 1.

Comparative Example 5

Liquid epoxy resin of a bisphenol A type (epoxy equivalent weight: 180; "Epikote 828 EL" manufactured by Japan Epoxy Resins Co., Ltd.) (28 parts) and 28 parts of tetrafunctional epoxy resin of a naphthalene type (epoxy equivalent weight: 163; "EXA-4700" manufactured by Dainippon Ink and Chemicals, Inc.) were dissolved in 15 parts of MEK and 15 parts of cyclohexanone by heating with stirring. Then 110 parts of an MEK solution of novolak resin which was a phenolic curing agent in a naphthalene structure ("SN-485" manufactured by Tohto Kasei Co., Ltd.; phenolic hydroxy group equivalent: 215; average hydroxyl group amount in a molecule: ⅓~⅖) in solid amount of 50%, 0.1 part of a curing catalyst ("2E4MZ" manufactured by Shikoku Chemicals Co.), 73 parts of spherical silica (average particle size: 0.5 μm; "SOC2" manufactured by Admatechs Co., Ltd.), 9 parts of liquid rubber-modified resin ("PB-3600" manufactured by Daicel Chemical Industries, Ltd.) and 27 parts of phenoxy resin varnish (a mixed solution of MEK and cyclohexanone where nonvolatile matter was 30% by mass; "YL6954BH30" manufactured by Japan Epoxy Resins Co., Ltd.; glass transition temperature: 130° C.) were mixed therewith followed by uniformly dispersing using a high-speed rotary mixer to prepare a resin varnish (amount of inorganic filler to the nonvolatile matter of the resin varnish was 38% by mass and the ratio of (total numbers of phenolic hydroxyl group) to (total numbers of epoxy group) was 0.78). A sheet-form adhesive film was prepared by the same method as in Example 1.

Example 7

Manufacture of Multi-Layered Printed Board (1) Preparation of Circuit Substrate

Circuit pattern was formed by etching on both sides of a layered plate comprising epoxy resin with a glass cloth substrate where both sides were covered with copper (thickness of copper foil: 18 μm; thickness of substrate: 0.8 mm; R5715ES manufactured by Matsushita Electric Works, Ltd.) and then dipped in CZ 8100 manufactured by Mec Co., Ltd. to conduct a roughening treatment of the copper surface whereupon a circuit substrate was prepared.

(2) Lamination of Adhesive Film

The adhesive film prepared in Examples 1 to 8 each is laminated on both sides of a circuit substrate using a vacuum pressurized laminator of a batch type MVLP-500 (trade name; manufactured by Meiki Co., Ltd.). The lamination is carried out in such a manner that depressurization was done for 30 seconds to make the pressure not higher than 13 hPa and then pressing is done for 30 seconds under the pressure of 0.74 MPa.

(3) Curing of Resin Composition

PET film is released from a laminated adhesive film and the resin composition is cured under a curing condition of 180° C. for 30 minutes.

(4) Formation of Via Hole

A via hole where diameter of insulating layer surface is 60 μm is formed by processing under the condition of frequency of 1,000 Hz, pulse width of 13 μ.second and shot numbers of 3 using a $CO_2$ laser processing machine (YB-HCS 03T04) manufactured by Matsushita Welding Systems Co., Ltd.

(5) Roughening Treatment

The circuit substrate is dipped at 60° C. for 5 minutes in a Swelling Dip Securigand P containing diethylene glycol monobutyl ether which is a swelling liquid manufactured by Atotech Japan K.K. After that, it is dipped at 80° C. for 20 minutes in a Concentrate Compact P (an aqueous solution of $KMnO_4$: 60 g/L; NaOH: 40/L) which is a roughening liquid manufactured by Atotech Japan K.K. Finally, it is dipped at 40° C. for 5 minutes in a Reduction Solution Securigand P which is a neutralizing liquid manufactured by Atotech Japan K.K.

(6) Plating by a Semi-Additive Process and Formation of Circuit

In order to form a circuit on the surface of the insulating layer, the circuit substrate is dipped in a solution for nonelectrolytic plating containing $PdCl_2$ and then dipped in a nonelectrolytic copper plating solution. After conducting an annealing treatment by heating at 150° C. for 30 minutes, an etching resist is formed and, after formation of pattern by etching, electrolytic plating with copper sulfate is carried out. After that, the etching resist is removed, flash etching is carried out and then an annealing treatment is carried out at 180° C. for 60 minutes to form a circuit of about 25 μm thickness on the insulating layer surface whereupon a multi-layered printed board is prepared.

Preparation of Sample for Measurement of Peel Strength and Ra Value:

(1) Undercoating Treatment of Layered Plate

Both sides of a layer plate comprising epoxy resin with a glass cloth substrate where both sides were covered with copper [thickness of copper foil: 18 μm; thickness of substrate: 0.8 mm; R5715ES manufactured by Matsushita Welding Systems Co., Ltd.] was dipped in CZ 8100 manufactured by Meiki Co., Ltd. to carry out a roughening treatment of the copper surface.

(2) Lamination of Adhesive Film

The adhesive film prepared in Examples and Comparative Examples each was laminated on both sides of the layered plate using a vacuum pressurized laminator of a batch type MVLP-500 (trade name; manufactured by Meiki Co., Ltd.). The lamination was carried out in such a manner that depressurization was done for 30 seconds to make the pressure not higher than 13 hPa and then pressing was done for 30 seconds under the pressure of 0.74 MPa.

(3) Curing of Resin Composition

PET film was released from the laminated adhesive film and the resin composition was cured under the curing condition of 180° C. for 30 minutes.

(4) Roughening Treatment

The layered plate was dipped in a Swelling Dip Securigand P containing diethylene glycol monobutyl ether which is a swelling liquid manufactured by Atotech Japan K.K., then it was dipped in a Concentrate Compact P (an aqueous solution of $KMnO_4$: 60 g/L; NaOH: 40 g/L) which is a roughening liquid manufactured by Atotech Japan K.K. and, finally, it was dipped in a Reduction Solution Securigand P which is a neutralizing liquid manufactured by Atotech Japan K.K.

Roughening condition 1: After dipping in a swelling liquid at 80° C. for 5 minutes, it was dipped in a roughening liquid at 80° C. for 15 minutes.

Roughening condition 2: After dipping in a swelling liquid at 60° C. for 5 minutes, it was dipped in a roughening liquid at 80° C. for 20 minutes.

The layered plate after such a roughening treatment was subjected to a measurement of surface roughness (Ra value).

(6) Plating by a Semi-Additive Process

In order to form a circuit on the surface of the insulating layer, the layered plate was dipped in a solution for a non-electrolytic plating containing $PdCl_2$ and then dipped in a nonelectrolytic copper plating solution. After conducting an annealing treatment by heating at 150° C. for 30 minutes, an etching resist is formed and, after formation of pattern by etching, an electrolytic plating with copper sulfate was carried out to form a conductor layer in a thickness of 25±10 μm. After that, an annealing treatment was carried out at 180° C. for 60 minutes. The layered plate was subjected to a measurement of peel strength of the plated copper.

Peeling Strength of Plated Conductor Layer (Peel Strength):

A cut was formed for a part of 10 mm width and 100 mm length in a conductor layer of the layered plate, one end thereof was peeled and grasped by a grasping tool and the load upon peeling for 35 mm in a vertical direction at the rate of 50 mm/minute at room temperature was measured.

Surface Roughness (Ra Value) after Roughening:

Ra value was determined using a surface roughness tester of a non-contacting type (WYKO NT 3300 manufactured by Veeco Instruments, Inc.). Incidentally, an Ra value is a mean value of heights calculated throughout the whole measuring region and, to be more specific, absolute value of height which varies within a measuring region is measured from the surface which is an average line and subjected to an arithmetic mean and that is able to be expressed by the following formula (1). In the formula, M and N are data numbers in each direction of the array. Here, it was measured by determining the mean roughness for ten points.

$$Ra = \frac{1}{MN}\sum_{k=1}^{M}\sum_{j=1}^{N}|Z_{jk}| \qquad (1)$$

Result of the peel strength of the plated conductor layer of the evaluating sample using an adhesive film prepared in Examples and Comparative Examples and the surface roughness (Ra value) after roughening are given in the following Table 1. As will be apparent from Table 1, the evaluating sample of Examples using the phenolic curing agent stipulated in the present invention is with a low roughness and high peel strength. On the contrary, in the case of Comparative Examples where other phenolic curing agent is used instead of the phenolic curing agent stipulated in the present invention, although the peel strength is relatively high, roughness is large and the product is not suitable for the preparation of fine wiring. In Comparative Example 3, where no rubber particle is contained, and in Comparative Example 4, where no phenoxy resin is contained, although the roughness is low, the peel strength is low. In Comparative Example 5, where liquid rubber is contained instead of rubber particles, although the peel strength is relatively high, the roughness is high, and the product is not suitable for the preparation of fine wiring.

TABLE 1

| Compounding Component | | Solid (%) | Ex. 1 | Ex. 2 | Ex. 3 | Ex. 4 | Ex. 5 | CE. 1 | CE. 2 | CE. 3 | CE. 4 | CE. 5 |
|---|---|---|---|---|---|---|---|---|---|---|---|---|
| 828 EL | Epoxy Resin (A1) | 100 | 28 | 28 | 28 | 28 | 28 | 28 | 28 | 28 | 28 | 28 |
| EXA 4700 | Epoxy Resin (A2) | 100 | 28 | 28 | 28 | 28 | 28 | 28 | 28 | 28 | 28 | 28 |
| LA-7052 | Phenolic Curing Agent | 60 | | | | | 50 | | | | | |
| TD 2090 | Phenolic Curing Agent | 60 | | | | | | 45 | | | | |
| CBN | Phenolic Curing Agent | 50 | | | | | | | | | | |
| SN 485 | Phenolic Curing Agent | 50 | 110 | | | | | | 110 | 110 | 110 | |
| GPH-103 | Phenolic Curing Agent | 50 | | | | 120 | | | | | | |
| NHN | Phenolic Curing Agent | 50 | | | | | | | | | | 75 |
| YLH 1027 | Phenolic Curing Agent | 60 | | | 65 | | | | | | | |
| YLH 1110 L | Phenolic Curing Agent | 60 | | 75 | | | | | | | | |
| YL 6954 BH 30 | Phenoxy Resin | 30 | 27 | 27 | 27 | 27 | 27 | 27 | 27 | | 27 | 27 |
| W 450A | Acrylate Rubber Particles | 100 | | | 8 | 9 | 8 | 7 | | 9 | | 8 |
| AC 3816N | Core/Shell Rubber Particles | 100 | 9 | 9 | | | | | | | | |
| PB 3600 | Liquid Rubber | 100 | | | | | | | | | 9 | |
| SOC 2 | Silica | 100 | 77 | 72 | 67 | 80 | 62 | 60 | 72 | 73 | 73 | 67 |
| 2E4 MZ | Curing Promoter | 100 | 0.1 | 0.1 | 0.1 | 0.1 | 0.1 | 0.1 | 0.1 | 0.1 | 0.1 | 0.1 |
| | Peel Strength (kgf/cm); Roughening Condition 1 | | 0.5 | 0.5 | 0.5 | 0.5 | 0.6 | 0.6 | 0.5 | 0.3 | 0.4 | 0.6 |
| | Peel Strength (kgf/cm); Roughening Condition 2 | | 0.6 | 0.6 | 0.6 | 0.7 | 0.6 | 0.6 | 0.5 | 0.3 | 0.4 | 0.6 |
| | Surface Roughness (nm); Roughening Condition 1 | | 360 | 390 | 370 | 380 | 350 | 600 | 600 | 200 | 280 | 600 |
| | Surface Roughness (nm); Roughening Condition 2 | | 230 | 350 | 290 | 270 | 220 | 500 | 500 | 150 | 200 | 500 |

CE: Comparative Example

TABLE 2

| Compounding Component | | solid (%) | Compound Amount (parts by mass) Ex. 9 |
|---|---|---|---|
| 828EL | Epoxy Resin (A1) | 100 | 28 |
| EXA4700 | Epoxy Resin (A2) | 100 | 28 |
| SN395 | Phenolic Curing Agent | 50 | 55 |
| YL6954BH 30 | Phenoxy Resin | 30 | 27 |
| W450A | Acrylate Rubber Particles | 100 | 8 |
| SOC2 | Silica | 100 | 67 |
| 2E4MZ | Curing Promoter | 100 | 0.1 |
| Peel Strength (kgf/cm) Roughening Conditions 1 | | | 0.5 |
| Peel Strength (kgf/cm) Roughening Conditions 2 | | | 0.6 |
| Surface Roughness (nm) Roughening Conditions 1 | | | 370 |
| Surface Roughness (nm) Roughening Conditions 2 | | | 240 |

INDUSTRIAL APPLICABILITY

The resin composition of the present invention and the adhesive film and the prepreg prepared from the resin composition are advantageously used as an interlayer insulating material for a multi-layered printed board, particularly for a multi-layered printed board manufactured by a build-up system.

Where a numerical limit or range is stated herein, the endpoints are included. Also, all values and subranges within a numerical limit or range are specifically included as if explicitly written out.

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A method for the manufacture of a multi-layered printed board,
    said method comprising forming an insulating layer on an inner layer circuit substrate and forming a conductor layer on said insulating layer,
    wherein said insulating layer is formed by thermally curing an epoxy resin composition which comprises:
    (A) an epoxy resin having two or more epoxy groups in a molecule;
    (B) a phenol type curing agent where an average hydroxyl group content in a molecule (mean value of (the total number of hydroxyl groups)/(the total number of benzene rings)) P is 0<P<1;
    (C) a phenoxy resin; and
    (D) core-shell type rubber particles,
    and said conductor layer is formed by copper plating on a roughened surface obtained by subjecting said insulating layer to surface roughening.

2. The method according to claim 1, wherein said phenol type curing agent of component (B) is a phenol type curing agent represented by formula (1) or (2):

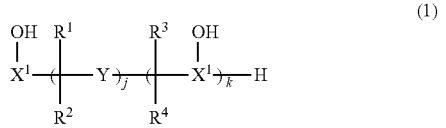

(1)

wherein $R^1$ to $R^4$ are each independently hydrogen atom or an alkyl group; $X^1$ is a benzene ring, hydroxyl benzene ring, naphthalene ring or hydroxyl naphthalene ring each of which may be substituted with an alkyl group; Y is a benzene ring, hydroxyl benzene ring, or a biphenyl ring each of which may be substituted with an alkyl group; and j and k are each independently a number of 1 to 15 as an average value;

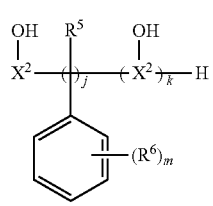
(2)

wherein $R^5$ is hydrogen atom or an alkyl group; $R^6$ is hydrogen atom, an alkyl group, or a thioalkyl group; $X^2$ is a benzene ring or naphthalene ring each of which may be substituted with an alkyl group; j and k are each a number of 1 to 15 as an average value;

and m is an integer of 1 to 5.

3. The method according to claim 1, wherein said phenol type curing agent of component (B) is a phenol type curing agent represented by formula (1') or (2'):

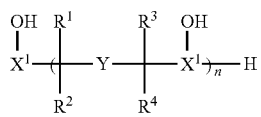
(1')

wherein $R^1$ to $R^4$ are each independently hydrogen atom or an alkyl group; $X^1$ is a benzene ring, hydroxyl benzene ring, naphthalene ring or hydroxyl naphthalene ring each of which may be substituted with an alkyl group; Y is a benzene ring, hydroxyl benzene ring, or a biphenyl ring each of which may be substituted with an alkyl group; and n is a number of 1 to 15 as an average value;

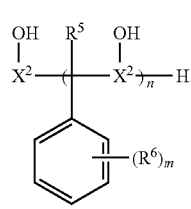
(2')

wherein $R^5$ is hydrogen atom or an alkyl group; R6 is hydrogen atom, an alkyl group, or a thioalkyl group; $X^2$ is a benzene ring or naphthalene ring each of which may be substituted with an alkyl group; n is a number of 1 to 15 as an average value; and m is an integer of 1 to 5.

4. The method according to claim 1, wherein the phenol type curing agent of component (B) is a phenol type curing agent represented by any of formulae (3) to (5):

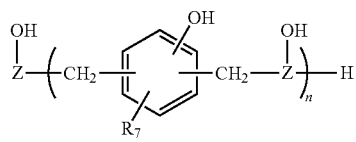
(3)

wherein $R^7$ is hydrogen atom or methyl group; Z is naphthalene ring; and n is a number of 1 to 15 as an average value;

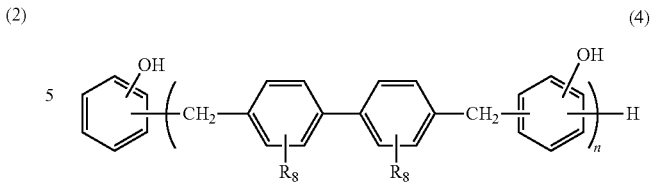
(4)

wherein $R^8$ and $R^9$ are each independently hydrogen atom or methyl group; and n is a number of 1 to 15 as an average value;

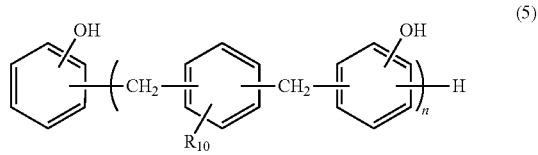
(5)

wherein $R^{10}$ is hydrogen atom or methyl group; and n is a number of 1 to 15 as an average value.

5. The method according to claim 1, wherein the phenol type curing agent of component (B) is a phenol type curing agent represented by formula (6):

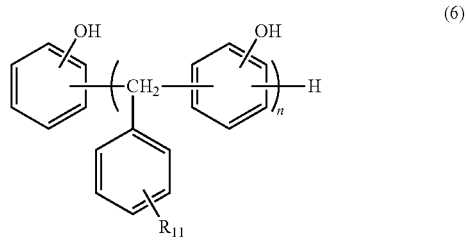
(6)

wherein $R^{11}$ is hydrogen atom, methyl group, or thiomethyl group; and n is a number of 1 to 15 as an average value.

6. The method according to claim 1, wherein said phenol type curing agent of component (B) is a phenol type curing agent represented by formula (7):

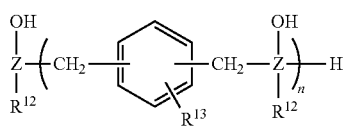
(7)

wherein $R^{12}$ is hydrogen atom, a methyl group or hydroxyl group; $R^{13}$ is hydrogen atom, a methyl group, or hydroxyl group; Z is a naphthalene ring; and n is a number of 1 to 15 as an average value.

7. The method according to claim 1, wherein the epoxy resin of component (A) comprises:
(A1) at least one first epoxy resin which is an aromatic epoxy resin having two or more epoxy groups in a molecule and being liquid at the temperature of 20° C.; and
(A2) at least one second epoxy resin which is an aromatic epoxy resin having three or more epoxy groups in a molecule and being solid at the temperature of 20° C.

8. The method according to claim 7, wherein said second epoxy resin of component (A2) has an epoxy equivalent weight of not more than 230.

9. The method according to claim 7, wherein said second epoxy resin of component (A2) has an epoxy equivalent weight within a range of 150 to 230.

10. The method according to claim 7, wherein said first epoxy resin (A1) and said second epoxy resin (A2) are compounded in a ratio (A1:A2) of the first epoxy resin (A1) to the second epoxy resin (A2) within a range of 1:0.3 to 1:2 in terms of mass.

11. The method according to claim 1, wherein, when the non-volatile component of the epoxy resin composition is 100% by mass, the content of the component (A) is 10 to 50% by mass, the content of the component (C) is 1 to 20% by mass, and the content of the component (D) is 1 to 10% by mass, based on the mass of the non-volatile components in said epoxy composition, and the ratio of the phenol type curing agent to the epoxy resin existing in the epoxy resin composition is from 1:0.5 to 1:1.5.

12. The method according to claim 1, wherein said epoxy resin composition further comprises an inorganic filler.

13. The method according to claim 12, wherein, when the non-volatile component of the epoxy resin composition is 100% by mass, the composition further comprises 10 to 75% by mass of the inorganic filler, based on the mass of the non-volatile components in said epoxy composition.

14. The method according to claim 1, wherein said surface roughening is carried out using an oxidizing reagent.

15. The method according to claim 1, wherein said surface roughening is carried out using a solution of alkaline permanganic acid.

16. The method according to claim 1, wherein said roughened surface of said insulating layer has a roughness of not more than 0.5 μm.

17. The method according to claim 1, wherein said roughened surface of said insulating layer has a roughness of not more than 0.35 μm.

18. The method according to claim 1, wherein said conductive layer exhibits a peel strength of not less than 0.6 kgf/cm.

19. A method for the manufacture of a multi-layered printed board, said method comprising forming an insulating layer on an inner layer circuit substrate and forming a conductor layer on said insulating layer, wherein said insulating layer is formed by laminating an adhesive film, which comprises an epoxy resin composition formed in a layer on a support film, on an inner layer circuit substrate and, with or without releasing the support film, the epoxy resin composition is thermally cured, followed by removing the support film in case the support film is present after curing, and said conductor layer is formed by conducting copper plating on a roughened surface prepared by surface roughening of said insulating layer surface, wherein said epoxy resin composition comprises:

(A) an epoxy resin having two or more epoxy groups in a molecule;

(B) a phenol type curing agent where an average hydroxyl group content in a molecule (mean value of (the total number of hydroxyl groups)/(the total number of benzene rings)) P is 0<P<1;

(C) a phenoxy resin; and (D) core-shell type rubber particles.

20. The method according to claim 19, wherein said roughened surface of said insulating layer has a roughness of not more than 0.5 μm.

21. The method according to claim 19, wherein said roughened surface of said insulating layer has a roughness of not more than 0.35 μm.

22. The method according to claim 19, wherein said conductive layer exhibits a peel strength of not less than 0.6 kgf/cm.

23. A method for the manufacture of a multi-layered printed board, said method comprising forming an insulating layer on an inner layer circuit substrate and forming a conductor layer on said insulating layer, wherein said insulating layer is formed by laminating a prepreg, which comprises an epoxy resin composition impregnated in a sheet-form reinforcing substrate comprising fiber, on an inner layer circuit substrate and thermally curing the epoxy resin composition and said conductor layer is formed by conducting copper plating on a roughed surface prepared by surface roughening of said insulating layer surface, wherein said epoxy resin composition comprises:

(A) an epoxy resin having two or more epoxy groups in a molecule;

(B) a phenol type curing agent where an average hydroxyl group content in a molecule (mean value of (the total number of hydroxyl groups)/(the total number of benzene rings)) P is 0<P<1;

(C) a phenoxy resin; and (D) core-shell type rubber particles.

24. The method according to claim 23, wherein said roughened surface of said insulating layer has a roughness of not more than 0.5 μm.

25. The method according to claim 23, wherein said roughened surface of said insulating layer has a roughness of not more than 0.35 μm.

26. The method according to claim 23, wherein said conductive layer exhibits a peel strength of not less than 0.6 kgf/cm.

* * * * *